United States Patent
Kamath

(10) Patent No.: US 7,567,641 B2
(45) Date of Patent: Jul. 28, 2009

(54) SAMPLE RATE CONVERSION SYSTEMS WITH AN INDEPENDENT INTERNAL OSCILLATOR

(75) Inventor: Gautham D. Kamath, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 758 days.

(21) Appl. No.: 10/869,721

(22) Filed: Jun. 16, 2004

(65) Prior Publication Data

US 2005/0282513 A1 Dec. 22, 2005

(51) Int. Cl.
*H03D 3/24* (2006.01)
(52) U.S. Cl. .................. 375/376; 310/331; 329/346; 329/358; 329/359; 330/137; 332/139; 332/141; 361/203
(58) Field of Classification Search ................ 375/334, 375/376; 360/46, 48; 341/61; 348/441
See application file for complete search history.

(56) References Cited

U.S. PATENT DOCUMENTS 4,954,824 A * 9/1990 Yamada et al. ............... 341/61
6,297,849 B1   10/2001 Stessen et al. .............. 348/500
6,441,857 B1 *  8/2002 Wicker et al. ............... 348/441
6,738,435 B1 *  5/2004 Becker ....................... 375/334

* cited by examiner

*Primary Examiner*—David C Payne
*Assistant Examiner*—Adolf Dsouza
(74) *Attorney, Agent, or Firm*—Hamilton & Terrile LLP.; Kent B. Chambers

(57) ABSTRACT

Because of the natural ability to reject clock jitter, the SRC circuits include an internal oscillator to provide an operating clock signal. The internal oscillator can be operated independently of any external frequency control signal, including input and output frame clocks. The internal oscillator can be implemented as a relatively low-cost fixed frequency oscillator. The use of a relatively low precision, inexpensive internal oscillator in an SRC circuit reduces the overall cost of SRC circuits while providing acceptable performance. Accordingly, reducing costs of SRC circuits also has a positive cost/benefit affect on the digital signal processing systems that use SRC circuits.

25 Claims, 5 Drawing Sheets

SAMPLE RATE CONVERSION SYSTEMS WITH AN INDEPENDENT INTERNAL OSCILLATOR

BACKGROUND OF THE INVENTION

1. Field of the Invention

The present invention relates to signal processing and more particularly relates to sample rate conversion systems having an independent internal oscillator to generate an operating clock signal.

2. Description of the Related Art

Digital electronics occupy a significant portion of the electronics market. Users or manufacturers often desire to combine multiple discrete digital electronic systems into a consolidated system. This modularity provides desirable system flexibility and expandability.

When combining discrete systems into a consolidated system, various compatibility issues arise such as disparate data sampling frequencies. For example, a user may desire to use a digital versatile disk (DVD) audio playback system to listen to audio sourced from a compact disk (CD) player. DVD audio playback systems generally have an input signal sample frequency of 96 kHz, and CD players generally have an output signal sample frequency of 44.1 kHz. Directly providing a 44.1 kHz sampled audio input signal to a DVD audio playback system that expects a 96 kHz sampled audio input signal would result in significant distortion of the audio signal. Sample rate conversion (SRC) circuits solve the sampling frequency incompatibility problem by converting the sampling frequency of data from a first sampling frequency used by a data source into a second sampling frequency used by a data sink. Thus, the SRC circuit facilitates interconnectivity and interoperability of multiple discrete signal processing systems.

FIG. 1 depicts a digital signal processing system 100 that includes an SRC circuit 102 to convert input data from data source 104 sampled at the sampling frequency of the input frame clock signal, fsi, into output data for data sink 106 sampled at the sampling frequency of the output frame clock signal, fso. The input and output frame clocks can be internal or external to the respective data source 104 and data sink 106. Clock source 108 depicts an external output frame clock signal source that provides the output frame clock signal to SRC circuit 102 and data sink 106. The SRC circuit 102 attempts to preserve the content of the input data while adding a minimal amount of noise. Many SRC circuits designs exist, and SRC circuits are often implemented as independently packaged integrated circuits (IC).

Data source 104 represents any data source, such as a CD player, that produces input data sampled at frequency fsi. Data sink 106 represents the intended recipient of the input data. Data sink 106 processes output data from SRC circuit 102. Two clocks separately generate the input frame clock signal and the output frame clock signal. The SRC circuit 102 includes two inputs to respectively receive an input frame clock signal having a frequency of fsi and an output frame clock signal having a frequency of fso. The SRC circuit 102 uses the input and output frame clocks to convert the sampling frequency of the input data to a sampling frequency compatible with the data sink 106.

The SRC circuit 102 is generally designed to provide compatibility with different input frame clocks and output frame clocks. Thus, SRC circuit 102 includes logic that automatically processes the input data at the correct sampling frequencies. For example, some embodiments of SRC circuit 102 automatically track arbitrary irrational and rational ratios of the output frame clock signal fso to the input frame clock signal fsi (i.e. fso/fsi). The ratio may be static or dynamic and may not be known exactly in advance of receiving the clock signals. In other embodiments, SRC circuit 102 directly uses the input frame clock and output frame clock to convert the input data into output data using the correct sampling frequencies. Phase lock loops can be used to lock on to the input and output frame clock signals to convert the data from the correct input data sampling frequency to the correct output data sampling frequency. If the input data frame clock frequency is known, at a minimum, a clock signal synchronized to a desired output data frame rate is provided to SRC circuit 102 to convey information about the output sample frequency fso.

The conversion logic of SRC circuit 102 can be implemented in any of a number of ways. In one embodiment, the SRC circuit 102 uses a digital to analog converter to convert the input data into an analog signal. The SRC circuit 102 also includes sampling circuitry to sample the analog signal at a sampling frequency of fso and convert the analog input data into digital data using a digital to analog converter. Some embodiments of SRC circuit 102 are configured in a "slave-slave" configuration. A "slave-slave" configuration refers to a configuration when the input data port 112 and output data port 110 are respective slaves to the input frame clock and the output frame clock. When an output data port 110 providing the output data is configured as a slave, the output frame clock provides the synchronized clock since the output frame clock is already provided as an input to SRC 102.

In addition to relying upon the input and output frame clocks, SRC circuit 102 uses an operating clock 114 to provide an operating clock signal to operate the internal digital logic hardware of SRC circuit 102. Operating clock 114 must have a high enough frequency to allow the SRC circuit 102 to compute the next demanded output data in time to begin processing the next input data. The operating clock signal may be synchronous or asynchronous to the input frame clock and the output frame clock signals and is usually higher in frequency than both frame clocks. Operating clock 114 is shown in dashed lines because it may be supplied internally to SRC circuit 102 or supplied from an external source.

Conventional SRC circuits, such as SRC circuit 102, use a high precision operating clock 114 to provide precise clock pulses. A high precision clock, by definition, generates a clock signal with a small amount of jitter. "Clock jitter" refers to any variation of a clock period from the clock's nominal period. For audio applications, a "small amount of clock jitter" can be defined as approximately less than 0.2 nanosecond root mean square (RMS) variation of a clock signal's period.

FIGS. 2, 3, and 4 depict various embodiments of operating clock 114. SRC circuits 200, 300, and 400 represent embodiments of SRC circuit 102 and differ only in the embodiment of operating clock 114. SRC circuit 200 includes an external pin 202 to receive a high precision operating clock signal from clock generator 204. Clock generator 204 can be any clock signal source, such as a crystal oscillator based circuit or a high quality phase-locked-loop, that generates a high precision operating clock signal. Generally SRC circuit 200 is disposed on a larger system board and clock generator 204 is also located on the same system board.

SRC circuit 300 generates a high precision operating clock signal using internal and external circuitry. SRC circuit 300 includes two external pins 302 and 304 to receive a resonating signal from an external resonator crystal circuit. SRC circuit 300 includes an internal amplifier 308 to amplify the resonating signal into an operating clock signal.

SRC circuit 400 generates a high precision operating clock signal using internal circuitry. SRC circuit 400 includes a high precision analog phase locked loop (PLL) circuit (PLL) 402 that provides the operating clock signal to the SRC core logic 404. In accordance with a select signal (not shown), multiplexer (MUX) 406 alternately selects the input frame clock signal and the output frame clock signal for processing PLL 402. PLL 402 generates a high precision multiple of the input and output frame clock signals. Alternatively, SRC circuit 400 could include two analog PLLs to respectively derive multiples of the input frame clock signal and output frame clock signal. Additionally, SRC circuit 400 may require an optional extra pin 408 (shown in dotted lines) to connect to an optional large, external filter 410 since the relatively low frequencies of the input and output frame clocks usually imply a low PLL bandwidth and, thus, large filter value components.

Because of the straightforward function of an SRC circuit, customers expect SRC circuit 102 (including embodiments SRC circuits 200, 300, and 400) to possess a low pin count (i.e. has few external pins). Customers also expect SRC circuit 102 to be sold at a low cost including the cost of necessary external components such as components used to generate an operating clock signal.

Generating the high precision operating clock signal for SRC circuit 102 including the SRC circuit 200, 300, and 400 embodiments adds a nontrivial amount of cost to the SRC circuits. To provide SRC circuit 200 with a high precision operating clock, SRC circuit 200 requires an extra pin 202, an external clock generator 204, and off-chip signal routing. To provide SRC circuit 300 with a high precision operating clock, SRC circuit 300 requires two extra pins 302 and 304, an external crystal resonator circuit 306, an amplifier 308, and off-chip signal routing. To provide SRC circuit 400 with a high precision operation clock, SRC circuit 400 requires an internal, precision PLL and MUX that occupy a significant amount of relatively expensive die area. Additionally, SRC circuit 400 often requires an external pin, an external filter circuit, and off-chip signal routing. Thus, the conventional approach of providing a high precision operating clock for SRC circuits adds a nontrivial amount of cost to the SRC circuits.

SUMMARY OF THE INVENTION

In one embodiment of the present invention a digital signal processing system includes a sample rate conversion (SRC) circuit to receive an input signal sampled at a frequency fsi into an output signal sampled at a frequency fso. The SRC circuit includes an internal oscillator, having a frequency derived internally and independent of any non-power supply related signal external to the SRC, to provide an operating clock signal to the SRC circuit.

In another embodiment of the present invention, a method of generating an operating clock signal for a sample rate conversion (SRC) circuit used to convert an input signal sampled at frequency fsi into an output signal sampled at fso, includes generating the operating clock signal for the SRC circuit using an oscillator internal to the SRC circuit. The operating clock signal is generated independently of any non-power related signal external to the SRC.

In another embodiment of the present invention, a sample rate conversion circuit includes an input terminal to receive an input signal and an output terminal to provide an output signal. The sample rate conversion signal also includes a sample rate conversion core, coupled to the input and output terminals, to convert the input signal into the output signal.

The sample rate conversion circuit also includes a fixed frequency oscillator coupled to an operating clock signal terminal of the sample rate conversion core and having components to generate an output signal independent of any frequency control signals.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Embodiments of the SRC circuit described herein include an internal oscillator that is not dependent upon external, frequency control signals and can be implemented relatively inexpensively using one or more low quality clock generation circuits. A low quality clock generation circuit can experience a large amount of clock jitter. A large amount of clock jitter for audio applications is greater than 0.2 nanosecond RMS variation of a clock signal's frequency and generally is approximately greater than 1.0 nanosecond RMS variation of a clock signal's frequency.

Embodiments of the SRC circuit described herein have particular applicability in the slave-slave configuration. The output data of an SRC circuit is a function of the input data and a ratio of the output frame clock fso to the input frame clock fsi, i.e. output data=f(input data, fso/fsi). Since, the ratio of frequencies fso and fsi affects output data fidelity to the input data, it has been observed that asynchronous SRC circuits possess a natural ability to reject clock jitter. "Rejecting" clock jitter means that the SRC circuits can tolerate clock jitter as long as the average long term frequency of the clocks does not significantly change. Short term clock jitter does not result in significant degradation of output data as measured by standard signal quality measures such as signal-to-noise ratio (SNR) or total harmonic distortion plus noise (THD+N). Accordingly, it has been determined that a high precision operating clock signal and high precision input and output frame clocks are unnecessary to achieve acceptable data conversion.

Because of the natural ability to reject clock jitter, SRC circuits described herein include an internal oscillator to provide an operating clock signal. The internal oscillator can be operated independently of any external clock, including input and output frame clocks. The internal oscillator can be implemented as a fixed frequency oscillator. "Fixed frequency oscillator" means that the oscillator does not have variable frequency controls, and, thus, after power-up the frequency of the oscillator is not dependent upon and is not controlled by any signal source external to the oscillator. However, the frequency of a fixed frequency oscillator may vary over time under normal circumstances due to, for example, power fluctuations, device degradation, and other factors. Because the SRC circuit 500 can tolerate high jitter, the internal oscillator can be designed and implemented with inexpensive components that may produce a large amount of clock jitter.

The use of a relatively low precision, inexpensive internal oscillator in an SRC circuit reduces the overall cost of SRC circuits while providing acceptable performance. Accordingly, reducing costs of SRC circuits also has a positive cost/benefit affect on the digital signal processing systems that use SRC circuits. The conversion of conventional SRC circuits to use an internal oscillator is straightforward.

Figure 1:
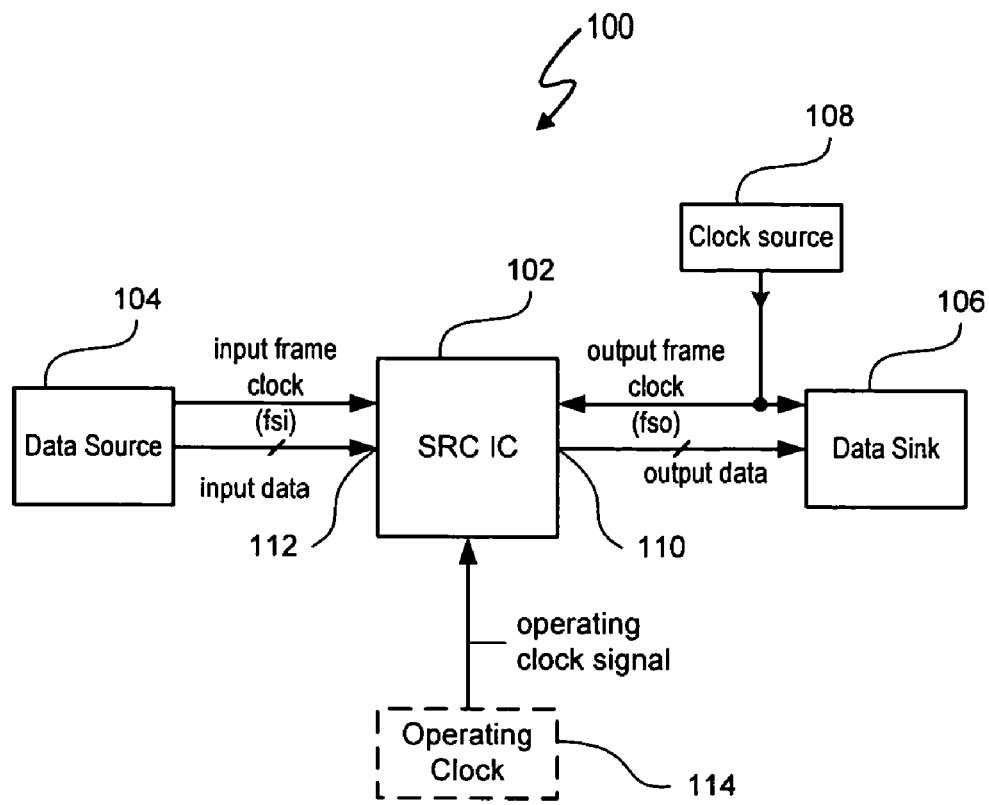
FIG. 1 (prior art) depicts a digital system that includes a sample rate conversion circuit.
Figure 2:
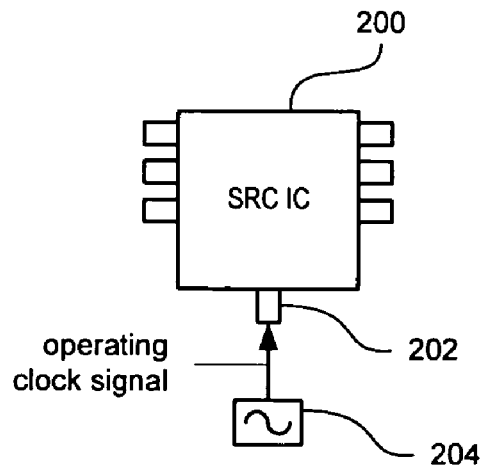
FIG. 2 (prior art) depicts an embodiment of the sample rate conversion circuit of FIG. 1 with an external, high precision clock generator.
Figure 3:
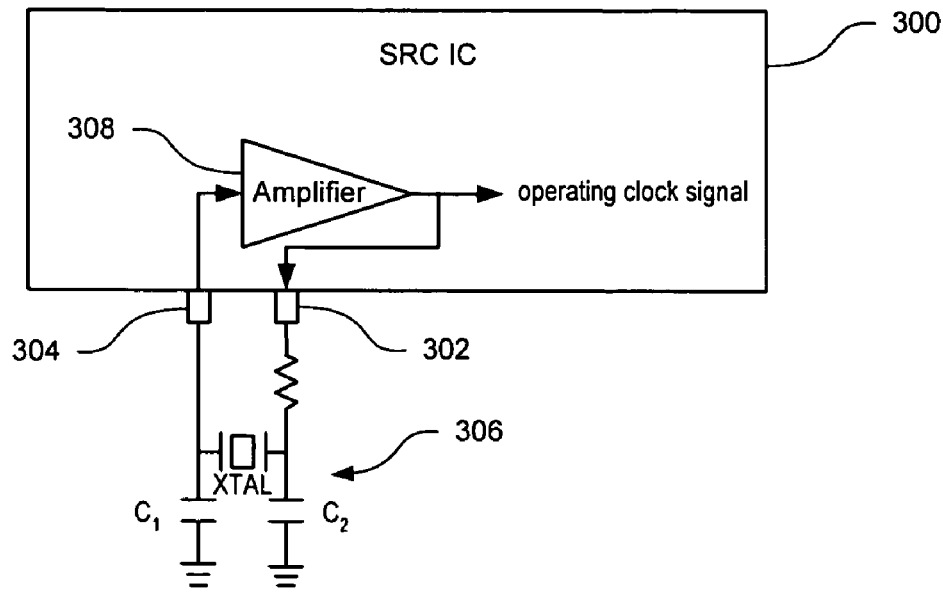
FIG. 3 (prior art) depicts an embodiment of the sample rate conversion circuit of FIG. 1 with an external crystal and internal amplifier.
Figure 4:
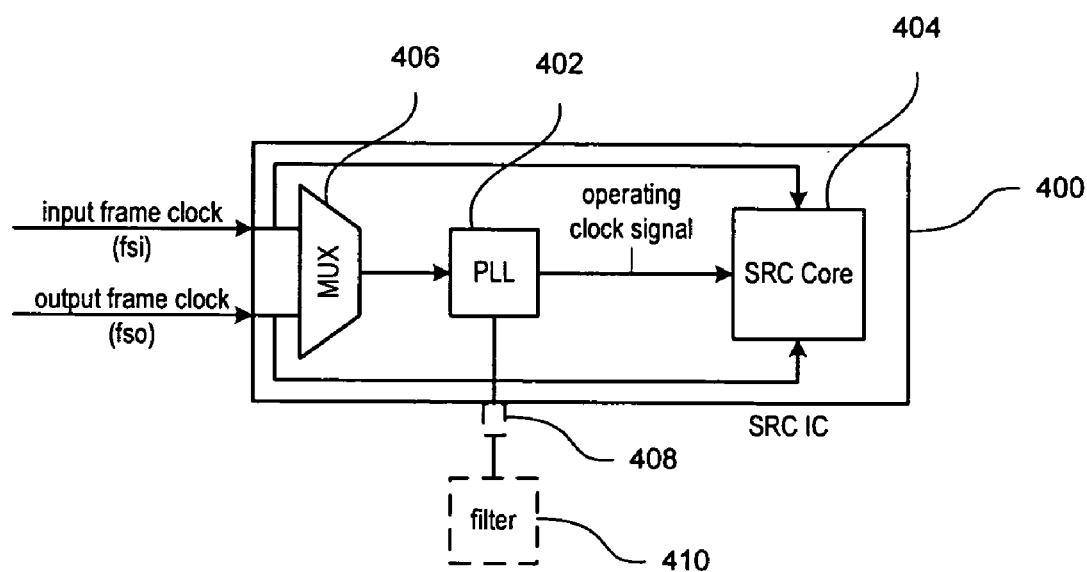
FIG. 4 (prior art) depicts an embodiment of the sample rate conversion circuit of FIG. 1 with an internal analog phase locked loop driven by an external frame clock.
Figure 5:
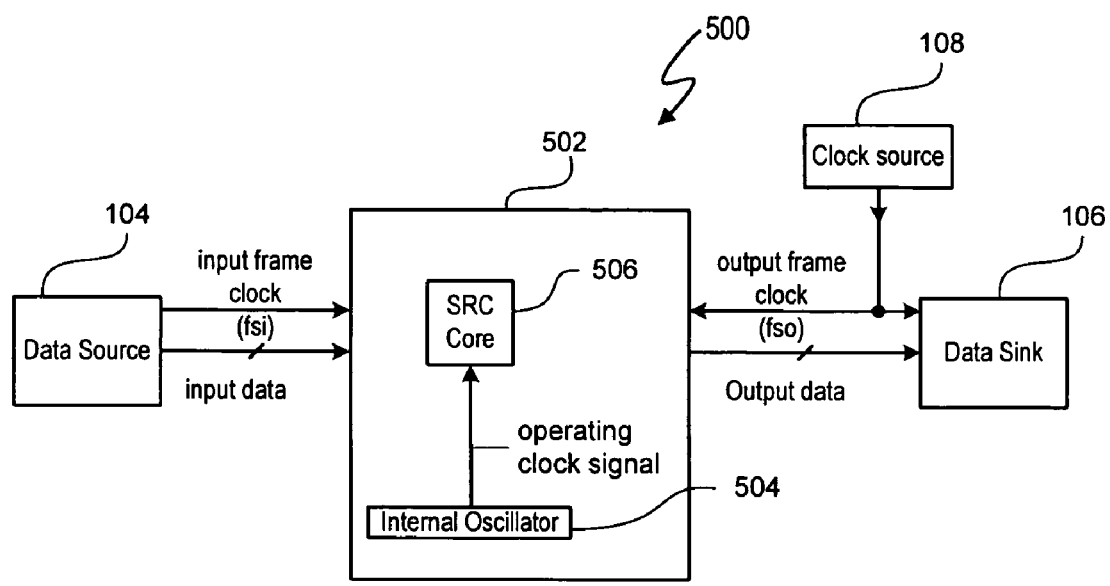
FIG. 5 depicts a sample rate conversion circuit that includes an internal oscillator operating independent of external signals.

FIG. 5 depicts a digital signal processing system 500 that includes SRC circuit 502 to convert the sampled input data from data source 104 into output data for data sink 106. The SRC core 506 includes the logic and, in some embodiments, code to convert input data into output data in the same manner as SRC circuit 102. However, SRC circuit 502 uses an internal oscillator 504 to generate an operating clock signal. The internal oscillator 504 receives power supply related signals, e.g. a voltage reference. In one embodiment, internal oscillator 504 is a fixed frequency oscillator and, thus, does not rely upon any frequency control signals and generates the operating clock signal independently of all non-power supply related signals. Non-power related signals include the input frame clock having a frequency of fsi and the output frame clock having frequency fso.

Figure 6:
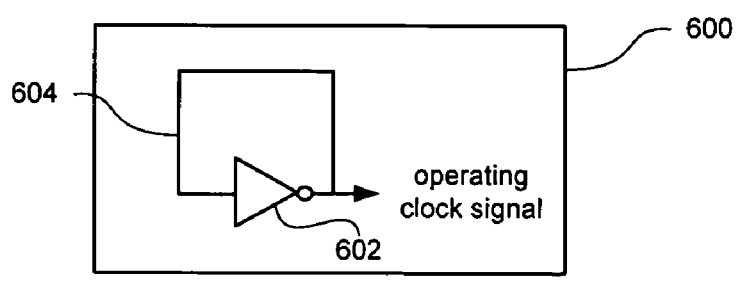
FIG. 6 depicts an embodiment of the internal oscillator of FIG. 5.

FIG. 6 depicts ring oscillator 600, which represents one embodiment of internal oscillator 504. Ring oscillator 600 achieves oscillation by connecting the input and output of inverter 602 with a feedback signal path 604. Thus, the operating clock signal has a frequency equal to the reciprocal of twice the delay of the signal through the inverter 602 and the feedback signal path 604. Inverter 600 represents a fixed frequency oscillator because inverter 600 does not include a variable frequency control.

Figure 7:
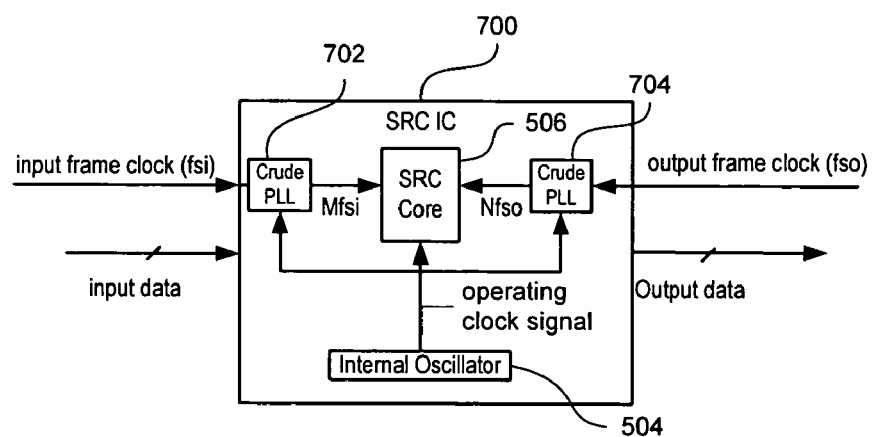
FIG. 7 depicts an embodiment of the sample rate conversion circuit that includes internal digital phase locked loops.

Some conventional SRC circuits use a high frequency multiple of both the input and output frame clocks. FIG. 7 depicts SRC circuit 700, which represents another embodiment of SRC circuit 500, that includes two "crude" digital PLLs 702 and 704. The PLLs 702 and 704 are "crude" because they each have a very high output signal jitter due to implementation with simple components representing approximations of multiples M and N of the respective input and output frame clocks, where M and N are positive numbers. Internal oscillator 504 provides an operating control signal to SRC core 506, and the operating signal serves as a reference signal for PLLs 702 and 704. The PLLs 702 and 704 are implemented individually using respective digital counters. PLLs 702 and 704 respectively count the duration of the period of the input frame clock and the period of the output frame clock with reference to the operating clock signal provided by internal oscillator 504 and generate respective output signals at approximately frequencies Mfsi and Nfso from edges of the operating clock signal. SRC circuit 700 rejects the jitter in output signals of PLLs 702 and 704. The crude PLLs 702 and 704 occupy a much smaller die area than high precision conventional counterparts.

Typically the operating control signal of SRC circuits operates under a double-sided constraint regardless of whether the operating control signal is generated internally or externally. The lower bound of the constraint refers to the minimum frequency of the operating control signal required to guarantee that the SRC circuit has enough time to convert the input data into the output data. This lower bound constraint is usually a function of the input frame clock and the output frame clock frequencies and is, thus, a relative number. The upper bound of the constraint refers to the maximum frequency of the operating control signal that will satisfy the critical path constraint of the SRC circuit. The critical path constraint refers to the signal path within the SRC circuit having the largest signal propagation delay. Thus, if the operating control frequency is too low the SRC circuit will not be able to convert all input data into output data and will, for example, drop input data samples, which disrupts the fidelity of the output data to the input data. If the frequency is too high, the SRC circuit can, for example, enter ambiguous states, thus, also disrupting the SRC circuit operation.

The SRC circuit should be designed to satisfy the double-sided constraint on the operating control signal by (1) designing the SRC circuit so that the SRC circuit is capable of accomplishing the data sample rate conversion without dropping received input data and (2) constraining the operating control signal frequency to be within the double-sided constraint.

Figure 8:
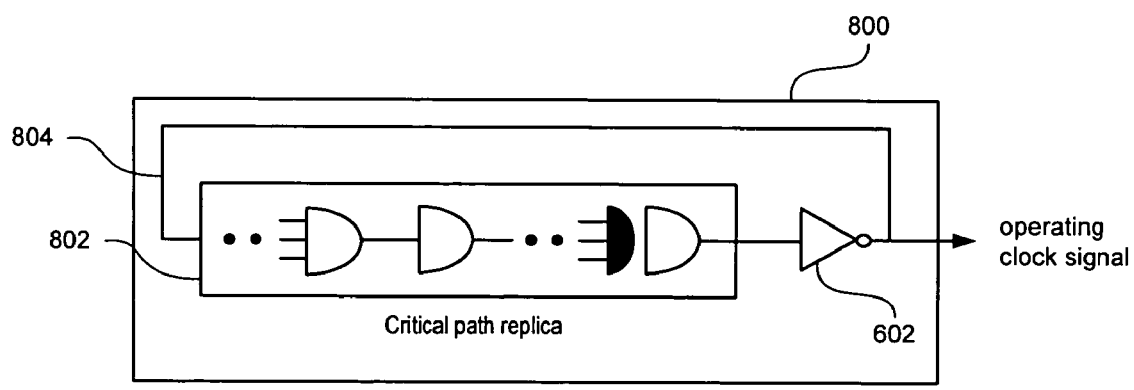
FIG. 8 depicts an embodiment of the internal oscillator of FIG. 5 that includes a critical path replica.

Referring to FIG. 8, internal oscillator 800, which represents one embodiment of internal oscillator 504, includes a critical path replica 802 in the feedback path 804 between the output and input of inverter 602. The critical path replica 802 represents the timed logic path of SRC circuit 502 having the longest propagation delay as determined by, for example, conventional static timing analysis tools. Because inverter 602 and the feedback path 804 add a finite signal propagation delay to the delay of the critical path replica 802, inverter 800 guarantees that the operating clock signal frequency will satisfy the upper bound of the double-sided constraint. SRC circuit 502 can be designed using well-known techniques to include a critical path and inverter 800 that allows the operating control signal to satisfy the lower bound of the double-sided constraint. Also, by including the critical path replica 802 in internal oscillator 800, the operating control signal will vary in accordance with fabrication processes, supply voltages, temperature, and other factors that could affect, for example, the upper bound of the double-sided constraint on the operating control signal frequency.

Figure 9:
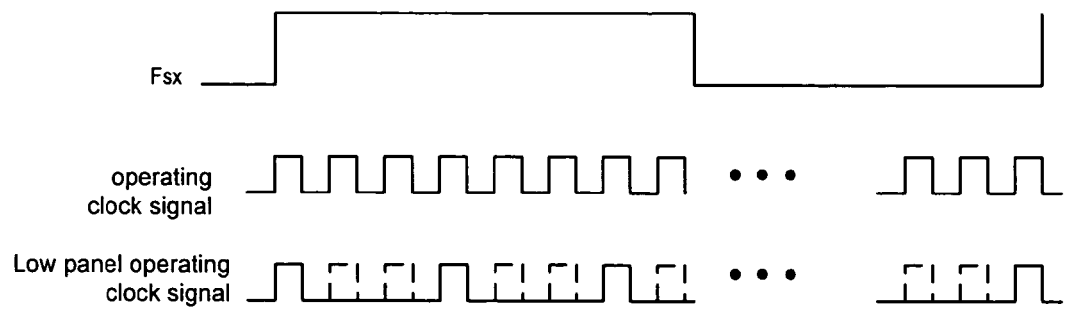
FIG. 9 depicts operating clock signals.

Although internal oscillator 800 satisfies the double-sided constraint on the operating control signal frequency, if the input and output frame clock frequencies are relatively low in comparison to the operating clock signal frequency generated by internal oscillator 800, internal oscillator 800 can cause SRC circuit 502 to operate much faster than necessary. Operating faster than necessary consumes an unnecessary amount of power. FIG. 9 depicts an optimal operating clock frequency Fsx that satisfies the double-sided constraint and causes SRC circuit 502 to avoid any unnecessary power consumption associated with a higher than necessary operating clock signal frequency. The depicted frequency of the unadjusted operating clock signal is approximately three (3) times higher than an optimal frequency for power consumption. The low panel operating clock signal drops two (2) out of every three (3) operating clock signal pulses. Operating SRC circuit 502 at the low panel operating clock signal frequency more closely approximates an optimal operating clock frequency.

By properly setting the output frequencies Mfsi and Nfso of SRC circuit 700 through the respective design of PLLs 702 and 704 using well-known design techniques, the operating frequency of SRC core 506 can be implicitly controlled to limit unnecessary power consumption. Alternatively, the frequency of internal oscillator 800 can be reduced by, for example, providing the operating clock signal to a gating circuit to generate the low panel operating clock signal.

Figure 10:
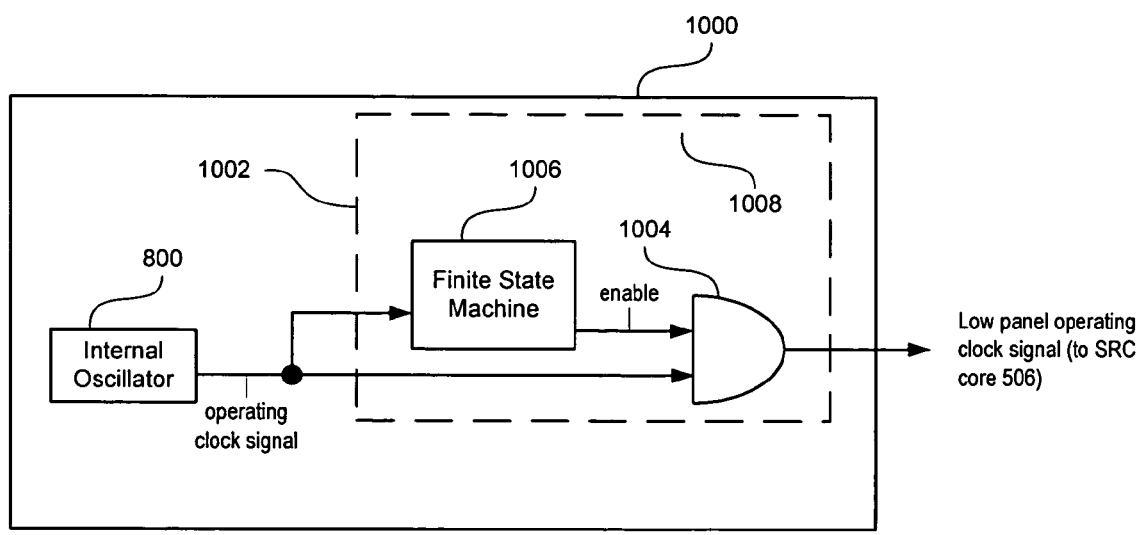
FIG. 10 depicts an embodiment of the internal oscillator of FIG. 5 that includes a frequency reduction gating circuit.

FIG. 10 depicts an internal oscillator and frequency reduction circuit 1000 that reduces the operating clock signal frequency of internal oscillator 800 to generate the low panel operating clock signal. The frequency reduction gating circuit 1002 includes an AND logic gate 1004 that provides the low panel operation clock signal to the SRC core 506 when both the operating clock signal from the internal oscillator 800 and the enable signal are high (i.e. logic one). A finite state machine 1006 generates the enable signal by detecting the operating clock signal from internal oscillator 800 and providing the enable signal after every Nth pulse of the low panel operation clock signal, where N is a frequency reduction factor. Thus, the frequency reduction gating circuit 1002 reduces the operating clock signal frequency from f to f/N. The frequency reduction gating circuit 1002 can be implemented in any of a variety of other ways, using hardware and/or software, by those of ordinary skill in the art.

Thus, by implementing the internal oscillator using inexpensive, fixed frequency components and capitalizing on the jitter rejection of SRC circuit 502, SRC circuit 502 obtains satisfactory conversion performance at a lower cost.

Although the present invention has been described in detail, it should be understood that various changes, substitutions and alterations can be made hereto without departing from the spirit and scope of the invention as defined by the appended claims.

What is claimed is:

1. A digital signal processing system comprising:
a sample rate conversion (SRC) circuit to receive an input signal sampled at a frequency fsi into an output signal sampled at a frequency fso, wherein the SRC circuit comprises an internal oscillator, having a frequency derived internally and independent of any non-power supply related signal external to the SRC, to provide an operating clock signal to the SRC circuit, wherein the internal oscillator comprises:
an inverter; and
a circuit path having a signal propagation delay greater than or equal to a critical path propagation delay in the SRC circuit.

2. The digital signal processing system of claim 1 wherein the internal oscillator is a fixed frequency oscillator.

3. The digital signal processing system of claim 1 wherein the sample rate conversion (SRC) circuit also includes input terminals to receive a first input frame clock signal having a frequency of fsi and a second input frame clock having a frequency of fso.

4. The digital signal processing system of claim 1 wherein the SRC is configured in a slave-slave configuration.

5. The digital signal processing system of claim 1 wherein the SRC circuit is configured as an integrated circuit, the system further comprising:
a circuit package having a plurality of leads coupled to the SRC integrated circuit to couple the SRC circuit to external devices, and the only oscillator contained in the circuit package is the internal oscillator.

6. The digital signal processing system of claim 1 wherein the SRC circuit receives only the operating clock signal from the internal oscillator.

7. The digital signal processing system of claim 1 wherein the internal oscillator comprises a ring oscillator.

8. The digital signal processing system of claim 1 wherein the SRC circuit further comprises:
a first phase locked loop circuit having a first input to receive a first input frame signal, a second input to receive the operating clock signal from the internal oscillator, and an output to provide an output signal Mfsi; and
a second phase locked loop circuit having a first input to receive a second input frame signal, a second input to receive the operating clock signal from the internal oscillator, and an output to provide an output signal Nfso.

9. The digital signal processing system of claim 1 wherein the SRC circuit further comprises:
an SRC core circuit to determine a ratio of frequency fsi to frequency fso and to convert the input signal into the output signal.

10. The digital signal processing system of claim 1 further comprising:
a gate circuit to regulate the internal frequency of the internal oscillator.

11. The digital signal processing system of claim 1 wherein the SRC circuit is configured as an integrated circuit.

12. A method of generating an operating clock signal for a sample rate conversion (SRC) circuit used to convert an input signal sampled at frequency fsi into an output signal sampled at fso, the method comprising:
generating the operating clock signal for the SRC circuit using an oscillator internal to the SRC circuit, wherein the operating clock signal is generated independently of any non-power related signal external to the SRC;
regulating a frequency of the operating clock signal; and
controlling a frequency of the operating clock signal using a circuit path having a signal propagation delay greater than or equal to a critical path propagation delay in the SRC circuit.

13. The method of claim 12 wherein the oscillator internal to the SRC circuit provides the operating clock signal only to the SRC circuit.

14. The method of claim 12 wherein the oscillator is a fixed-frequency oscillator.

15. The method of claim 12 wherein the SRC circuit receives only the operating clock signal from the oscillator internal to the SRC circuit.

16. The method of claim 12 wherein the oscillator internal to the SRC circuit comprises a ring oscillator.

17. The method of claim 12 wherein generating the operating clock signal of the SRC circuit further comprises using:
a first phase locked loop circuit having a first input to receive a first input frame signal, a second input to receive the operating clock signal from the oscillator internal to the SRC circuit, and an output to provide an output signal Mfsi; and
a second phase locked loop circuit having a first input to receive a second input frame signal, a second input to receive the operating clock signal from the oscillator internal to the SRC circuit, and an output to provide an output signal Nfso.

18. The method of claim 12 farther comprising:
converting the input signal into the output signal.

19. The method of claim 18 further comprising determining a ratio of frequency fsi to frequency fso to convert the input signal into the output signal.

20. The method of claim 12 further comprising:
reducing the operating clock signal frequency.

21. The method of claim 12 wherein the SRC circuit is configured as an integrated circuit.

22. A sample rate conversion circuit comprising:
an input terminal to receive an input signal;
an output terminal to provide an output signal;
a sample rate conversion core, coupled to the input and output terminals, to convert the input signal into the output signal; and
a fixed frequency oscillator coupled to an operating clock signal terminal of the sample rate conversion core and having components to generate an output signal independent of any frequency control signals and independent of any non-power supply related signal external to the sample rate conversion circuit, wherein the fixed frequency oscillator comprises an operating clock signal circuit path having a signal propagation delay at least as long as a critical path propagation delay of the sample rate conversion core.

23. The sample rate conversion circuit of claim 22 wherein the fixed frequency oscillator comprises a ring oscillator.

24. The sample rate conversion circuit of claim 22 wherein the fixed frequency oscillator comprises a crude, digital phase locked loop coupled between the fixed frequency oscillator and the sample rate conversion core.

25. The sample rate conversion circuit of claim 22 wherein the sample rate conversion circuit is configured as an integrated circuit.

* * * * *